United States Patent
Park et al.

(10) Patent No.: US 8,809,676 B2
(45) Date of Patent: Aug. 19, 2014

(54) THIN FILM SOLAR CELL AND METHOD OF MANUFACTURING THE SAME

(75) Inventors: Won-Seo Park, Gyeonggi-do (KR);
Jeong-Woo Lee, Gyeonggi-do (KR);
Seong-Kee Park, Gyeonggi-do (KR);
Kyung-Jin Shim, Gyeonggi-do (KR);
Tae-Youn Kim, Seoul (KR); Yi-Yin Yu, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 803 days.

(21) Appl. No.: 12/633,255

(22) Filed: Dec. 8, 2009

(65) Prior Publication Data
US 2010/0193021 A1 Aug. 5, 2010

(30) Foreign Application Priority Data
Feb. 5, 2009 (KR) .................. 10-2009-0009309

(51) Int. Cl.
*H01L 31/18* (2006.01)
*H01L 31/0224* (2006.01)
*H01L 31/052* (2014.01)

(52) U.S. Cl.
CPC .... *H01L 31/022466* (2013.01); *H01L 31/1884* (2013.01); *H01L 31/0527* (2013.01); *Y02E 10/52* (2013.01)
USPC ............. 136/256; 136/259; 438/69; 438/71; 438/72; 219/121.69

(58) Field of Classification Search
USPC ........... 438/72, 69, 71; 219/121.69; 136/256, 136/259
See application file for complete search history.

(56) References Cited

U.S. PATENT DOCUMENTS

| 4,126,460 | A | * | 11/1978 | Okishi | ................. 430/300 |
| 6,521,391 | B1 | * | 2/2003 | Bennett et al. | ........... 430/275.1 |
| 2002/0117199 | A1 | * | 8/2002 | Oswald | ................. 136/256 |
| 2007/0151596 | A1 | * | 7/2007 | Nasuno et al. | ............. 136/256 |

FOREIGN PATENT DOCUMENTS

| CN | 101232058 | 7/2008 |
| CN | 101246917 | 8/2008 |

OTHER PUBLICATIONS

First Notification of Office Action for corresponding Chinese Patent Application No. 200910246832.0, dated Aug. 15, 2011.
Second Notification of Office Action dated May 23, 2012 in a counterpart Chinese application.
Third Notification of Office Action from The State Intellectual Property Office of China dated Dec. 7, 2012 in counterpart Chinese application No. 200910246832.0.

* cited by examiner

*Primary Examiner* — Thanh-Truc Trinh
(74) *Attorney, Agent, or Firm* — Morgan, Lewis & Bockius LLP

(57) ABSTRACT

A thin film solar cell includes a first substrate, a transparent conductive layer on an inner surface of the first substrate, the transparent conductive layer having an uneven top surface and including through-holes, a light-absorbing layer on the transparent conductive layer, a reflection electrode on the light-absorbing layer, a second substrate facing and attached with the first substrate, and a polymeric material layer on an inner surface of the second substrate.

8 Claims, 8 Drawing Sheets

THIN FILM SOLAR CELL AND METHOD OF MANUFACTURING THE SAME

This application claims the benefit of Korean Patent Application No. 10-2009-0009309, filed on Feb. 5, 2009, which is hereby incorporated by reference in its entirety.

BACKGROUND OF THE INVENTION

1. Field of the Invention

The present invention relates to a thin film solar cell, and more particularly, to a thin film solar cell and a method of manufacturing the same that improve energy conversion efficiency.

2. Discussion of the Related Art

In general, solar cells are classified into various types according to a material of a light-absorbing layer. Solar cells may be categorized into silicon solar cells having silicon as a light-absorbing layer, compound thin film solar cells using CIS(CuInSe$_2$) or CdTe, III-V group solar cells, dye-sensitized solar cells, and organic solar cells.

Among the solar cells, silicon solar cells include crystalline solar cells and amorphous thin film solar cells. Bulk-type crystalline solar cells are widely used. However, the crystalline solar cells have increasing production costs due to expensive silicon substances and complicated manufacturing processes.

Recently, by forming a solar cell of a thin film type on a relatively low cost substrate, such as glass, metal or plastic, instead of a silicon wafer, researches for reducing the production costs have been made.

A thin film solar cell according to the related art will be explained hereinafter with reference to accompanying drawings.

FIG. 1 is a cross-sectional view of a thin film solar cell according to the related art. In FIG. 1, the related art thin film solar cell 5 includes first and second substrates 10 and 20 of glass or plastic, which are attached with and face each other. A transparent conductive layer 30 is formed on an inner surface of the first substrate 10. A light-absorbing layer 40, which has a p-i-n structure and includes a p-type silicon layer 40a, an i-type silicon layer 40b and an n-type silicon layer 40c, is formed on the transparent conductive layer 30. A reflection electrode 50 is formed on the light-absorbing layer 40 at each of the unit cells C. A polymeric material layer 60 is formed on an inner surface of the second substrate 20 and contacts the reflection electrode 50 of the first substrate 10.

Here, the reflection electrode 50 is formed of one selected from a conductive material group including a material that has relatively high reflectance such as aluminum (Al) and silver (Ag). The reflection electrode 50 maximizes scattering properties of light passing through the light-absorbing layer 40 by reflecting the light.

Although not shown in the figure, an adhesive layer may be formed between the polymeric material layer 60 and the reflection electrode 50 to firmly attach the first and second substrates 10 and 20.

In the thin film solar cell 5, external light incident on the first substrate 10 from the outside passes through the first substrate 10 and the p-type silicon layer 40a and is absorbed by the i-type silicon layer 40b. Electrons and holes are generated in the i-type silicon layer 40b due to the light having a larger energy than a band gap energy of silicon. The electrons and the holes in the i-type silicon layer 40b are diffused to the p-type silicon layer 40a and the n-type silicon layer 40c, respectively, due to an internal electric field and are provided to an external circuit through the transparent conductive electrode 30 and the reflection electrode 50, respectively. According to this, solar energy can be converted into electrical energy.

However, the related art thin film solar cell 5 has a limitation on increasing energy conversion efficiency because it absorbs light with a short wavelength within a range of 200 nm to 800 nm. To improve the energy conversion efficiency, a design that the transparent conductive layer 30 has an uneven surface has been suggested so that the light absorption is increased.

FIG. 2A is a cross-sectional view of schematically illustrating a thin film solar cell including a transparent conductive layer with an uneven surface according to the related art, and FIG. 2B is a view of showing a path of light in the thin film solar cell of FIG. 2A. Here, in FIGS. 2A and 2B, the same parts as FIG. 1 may have the same references, and explanation for the same parts will be omitted.

As shown in FIGS. 2A and 2B, the transparent conductive layer 30 having an uneven surface is formed on the first substrate 10. That is, the transparent conductive layer 30 has peaks and valleys alternating each other at its top surface. The uneven surface of the transparent conductive layer 30 increases and improves conversion efficiency of solar energy.

However, in the thin film solar cell 5, there is light loss when the external light passes through the first substrate 10 and the transparent conductive layer 30. Accordingly, even though the energy conversion efficiency is increased due to the increase of light-scattering and light-transmitting distances at the surface of the transparent conductive layer 30, the light loss may be caused by reflection at a interface between the transparent conductive layer 30 and the light-absorbing layer 40, and the energy conversion efficiency of the thin film solar cell 5 is insufficiently improved.

That is, as shown in FIG. 2B, when the transparent conductive layer 30 has the uneven surface, the scattering properties at the surface are improved. However, when the light passes through the interface between the transparent conductive layer 30 and the light-absorbing layer 40, there is light loss due to reflection and absorption. In the thin film solar cell 5, about 25% of a total loss of the energy conversion efficiency may result from the light loss due to the reflection and absorption at the interface between the transparent conductive layer 30 and the light-absorbing layer 40.

SUMMARY OF THE INVENTION

Accordingly, the present invention is directed to a thin film solar cell and a method of manufacturing the same that substantially obviate one or more of the problems due to limitations and disadvantages of the related art.

An object of the present invention is to provide a thin film solar cell and a method of manufacturing the same that increase the quantity of light provided to a light-absorbing layer and maximize the energy conversion efficiency.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a thin film solar cell includes a first substrate, a transparent conductive layer on an inner surface of the first substrate, the transparent conductive layer having an uneven top surface and including through-holes, a light-absorbing layer on the transparent conductive layer, a reflection electrode on the light-absorbing layer, a second substrate facing and attached with the first substrate, and a polymeric material layer on an inner surface of the second substrate.

In another aspect, a method of manufacturing a thin film solar cell includes forming a transparent conductive material layer on a first substrate, the transparent conductive material layer having an uneven top surface and including particles of a light-absorbing material, forming through-holes in the transparent conductive material layer by irradiating a laser beam to the particles, wherein the particles absorb the laser beam and break away, forming a transparent conductive layer in each unit cell by cutting the transparent conductive material layer, forming a light-absorbing layer on the transparent conductive layer, forming a reflection electrode on the light-absorbing layer, forming a polymeric material layer on a second substrate, and attaching the first and second substrates such that the polymeric material layer face the reflection electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to an embodiment of the present invention, an example of which is illustrated in the accompanying drawings.

Figure 1:
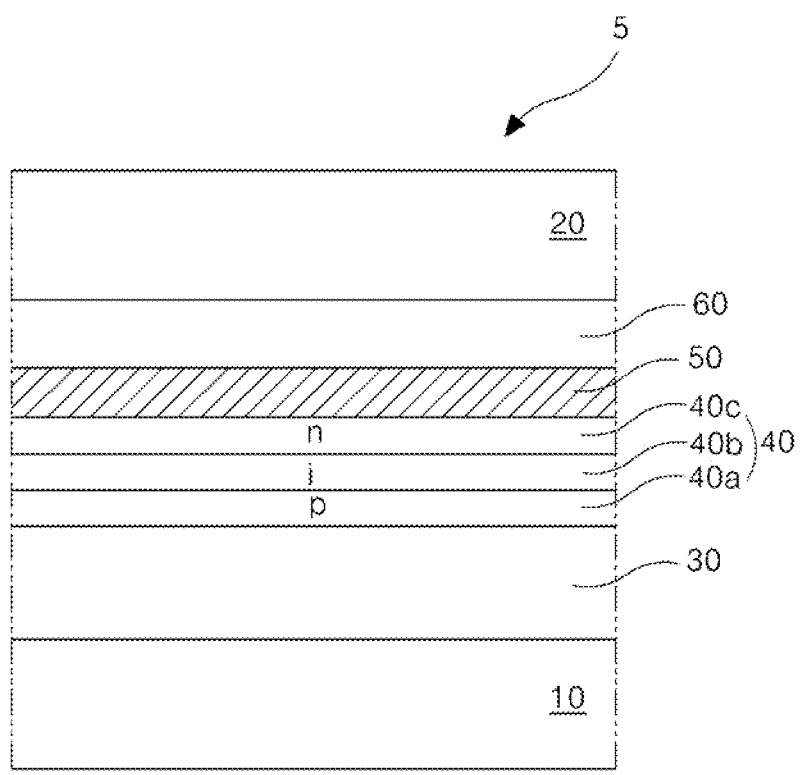
FIG. 1 is a cross-sectional view of a thin film solar cell according to the related art.
Figure 2A:
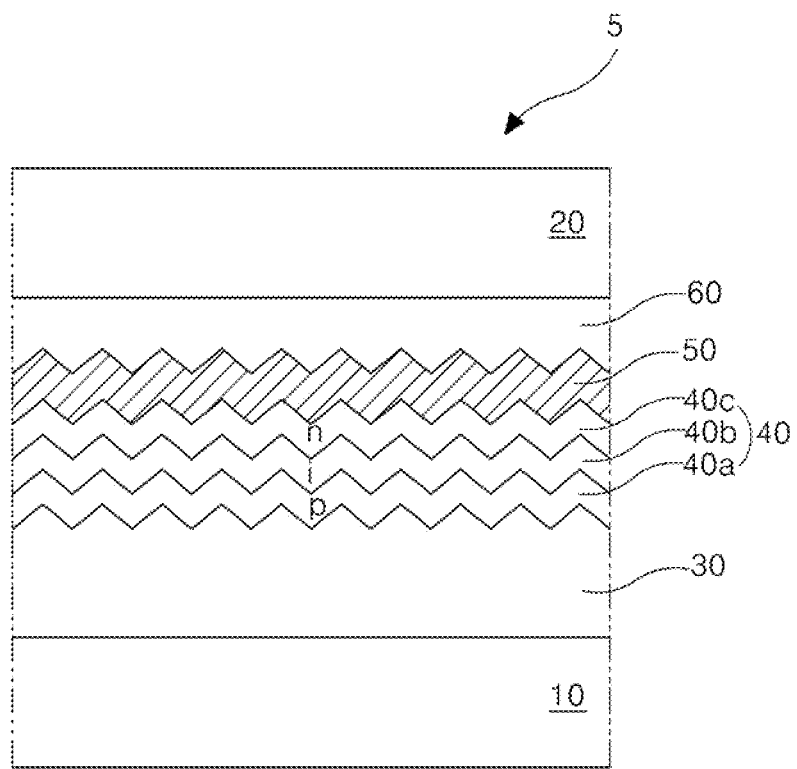
FIG. 2A is a cross-sectional view of schematically illustrating a thin film solar cell including a transparent conductive layer with an uneven surface according to the related art.
Figure 2B:
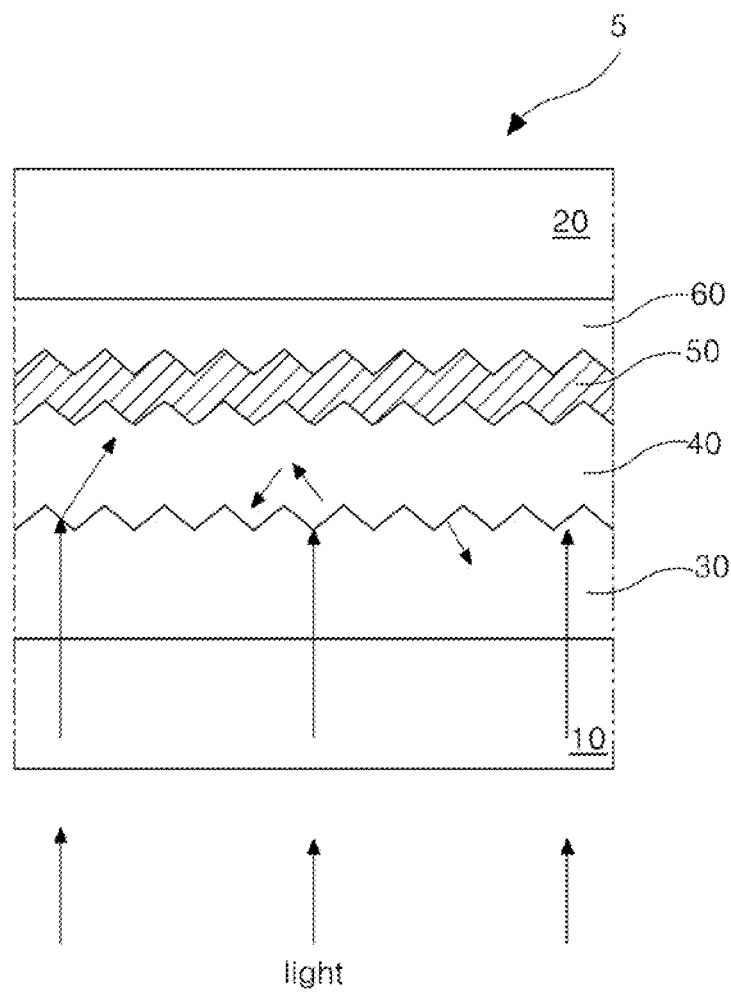
FIG. 2B is a view of showing a path of light in the thin film solar cell of FIG. 2A.
Figure 3:
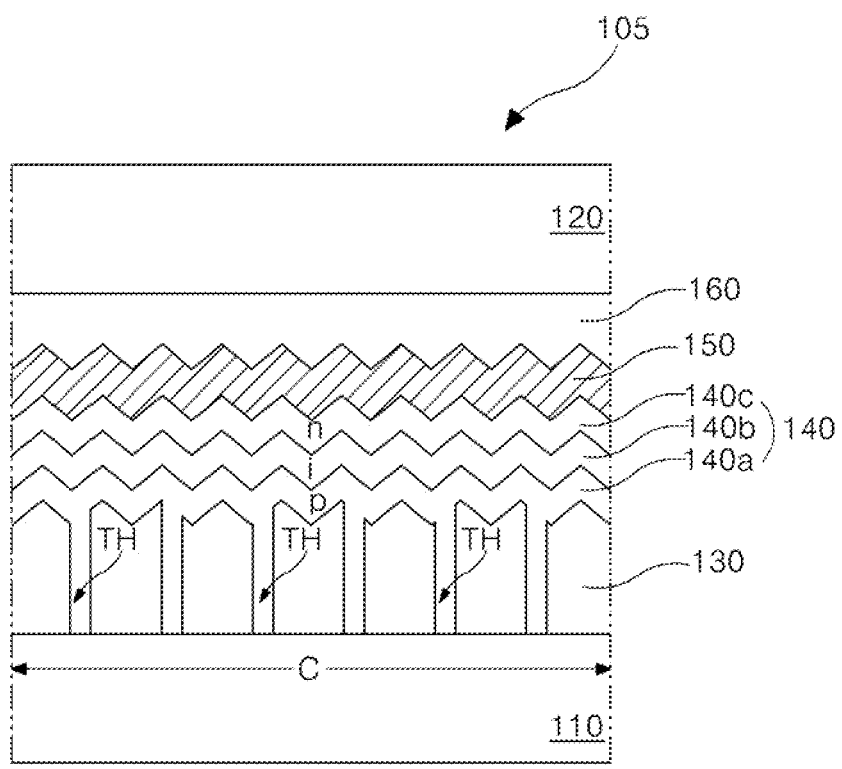
FIG. 3 is a cross-sectional view of a thin film solar cell according to an exemplary embodiment of the present invention.

FIG. 3 is a cross-sectional view of a thin film solar cell according to an exemplary embodiment of the present invention.

In FIG. 3, the thin film solar cell 105 of the present invention includes a first substrate 110 and a second substrate 120 of glass or plastic, which are attached with and face each other. A transparent conductive layer 130 having an uneven top surface is formed on an inner surface of the first substrate 110. The uneven top surface of the transparent conductive layer 130 includes peaks and valleys. The transparent conductive layer 130 includes through-holes TH, which extend from the top surface to a bottom surface of the transparent conductive layer 130. A light-absorbing layer 140 is formed on the transparent conductive layer 130, and a reflection electrode 150 is formed on the light-absorbing layer 140. A polymeric material layer 160 is formed on an inner surface of the second substrate 120 facing the first substrate 110, and the polymeric material layer 160 contacts the reflection electrode 150.

The reflection electrode is formed of one selected from a conductive material group including a material that has relatively high reflectance such as aluminum (Al) and silver (Ag). The reflection electrode 150 reflects light passing through the light-absorbing layer 140 toward the first substrate 110.

The light-absorbing layer 140 may have a p-i-n structure and include a p-type silicon layer 140$a$, an i-type silicon layer 140$b$ and an n-type silicon layer 140$c$ sequentially layered on the transparent conductive layer 130.

The transparent conductive layer 130 may be formed of one selected from a transparent conductive oxide material group including indium tin oxide (ITO), tin oxide (SnO:F or SnO:B) and zinc oxide (ZnO:Al or ZnO:Ga).

The through-holes TH pass light incident on the transparent conductive layer 130 as it is to thereby minimize light loss due to light scattering and absorption. The through-holes TH may be formed by injecting particles of a light-absorbing material into the transparent conductive layer 130 and radiating a laser beam to the particles. This will be explained in more detail later.

In the present invention, since the transparent conductive layer 130 has the uneven top surface and includes the through-holes TH, external light passing through the through-holes TH can go into the light-absorbing layer 140 without any obstruction. Specially, the light passing through the through-holes TH is diffracted at the uneven top surface of the transparent conductive layer 130, and light scattering and path are extended due to the peaks and valleys. Therefore, the light can be provided to the light-absorbing layer 140 with a minimum loss. Accordingly, the energy conversion efficiency can be maximized.

A method of manufacturing a thin film solar cell according to the present invention will be explained with reference to accompanying drawings.

Figure 4A:
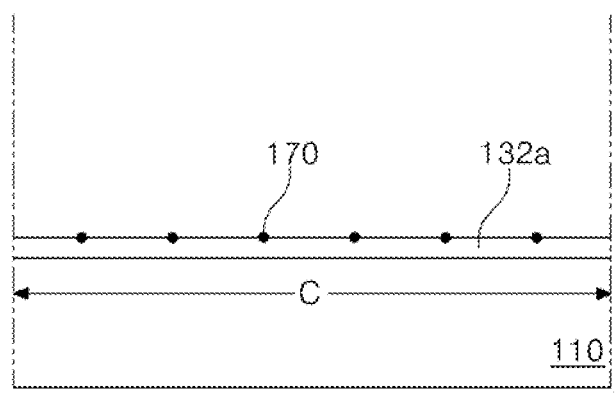
FIGS. 4A to 4H are cross-sectional views of illustrating a thin film solar cell in steps of a method of manufacturing the same according to the present invention.
Figure 4B:
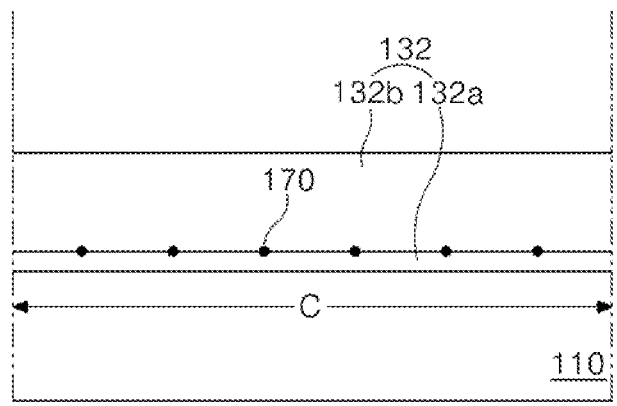
Figure 4C:
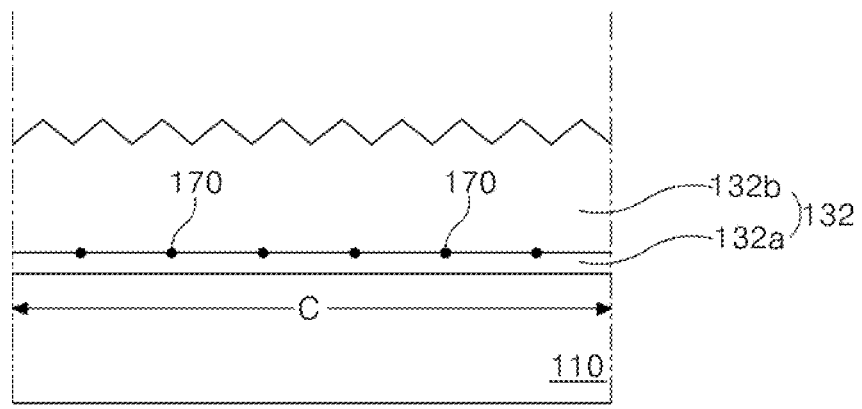
Figure 4D:
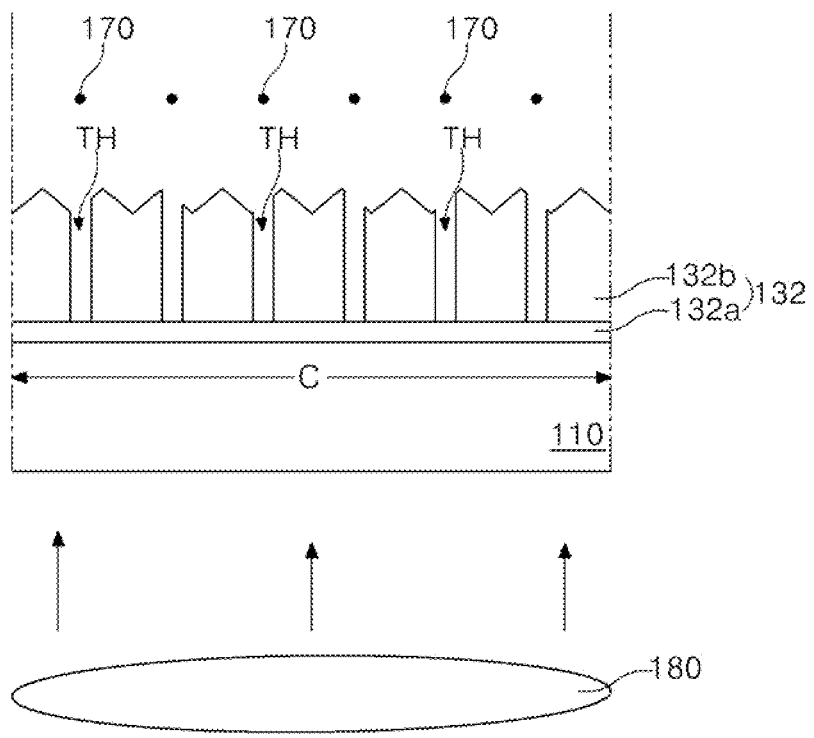
Figure 4E:
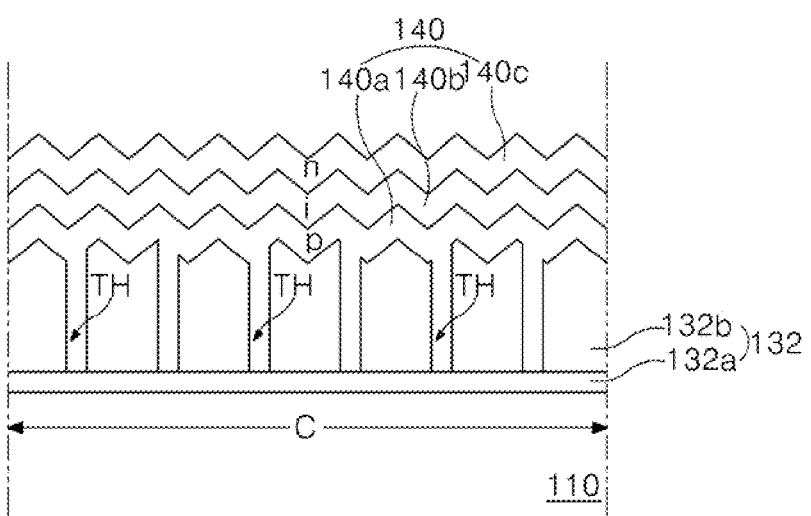
Figure 4F:
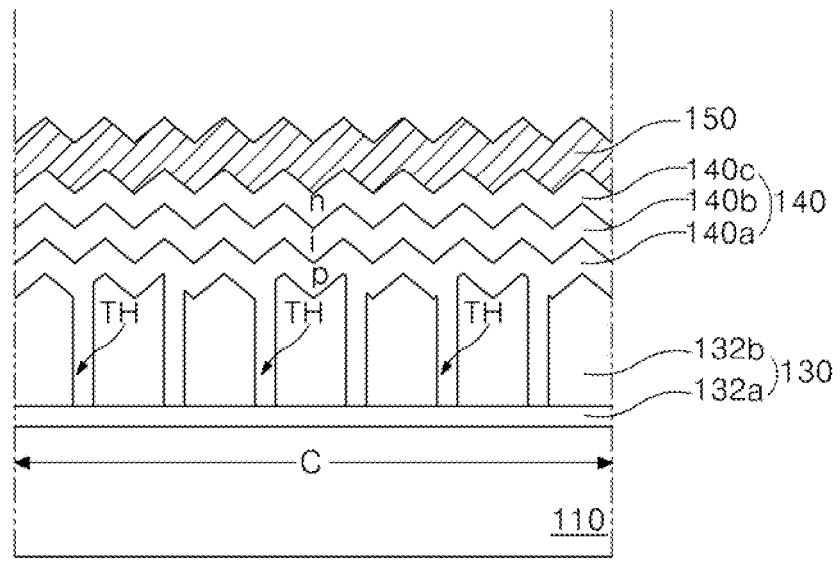
Figure 4G:
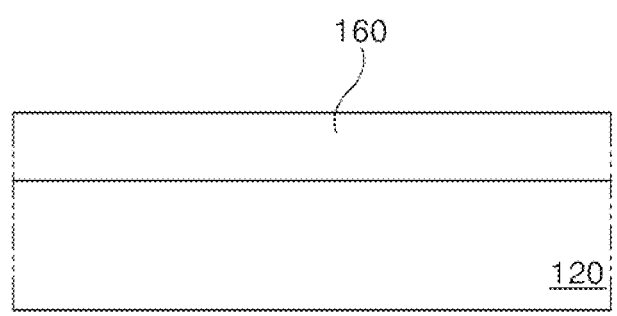
Figure 4H:
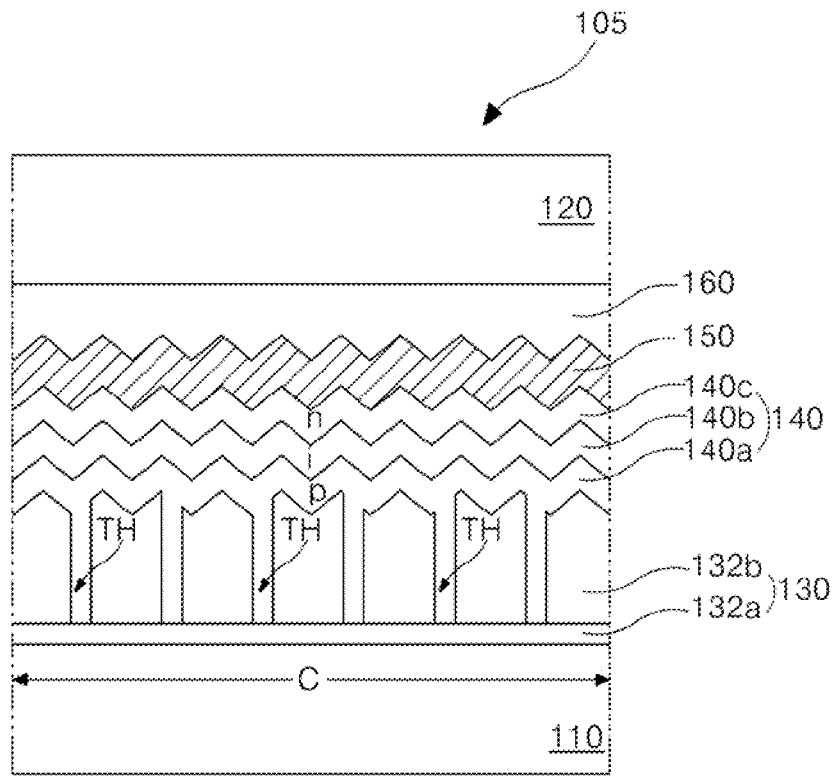

FIGS. 4A to 4H are cross-sectional views of illustrating a thin film solar cell in steps of a method of manufacturing the same according to the present invention. FIGS. 4A to 4F show steps of fabricating a first substrate for a thin film solar cell according to the present invention, FIG. 4G shows a step of fabricating a second substrate for a thin film solar cell according to the present invention, and FIG. 4H shows a step of attaching first and second substrates for a thin film solar cell according to the present invention.

In FIG. 4A, a first transparent conductive material layer 132 is formed on a first substrate 110 by depositing one selected from a transparent conductive material group including oxide. The transparent conductive material group may include indium tin oxide (ITO), tin oxide (SnO:F or SnO:B) and zinc oxide (ZnO:Al or ZnO:Ga). The first substrate 110 may include glass or plastic. The first transparent conductive material layer 132 may have a first thickness.

Next, particles 170 including a light-absorbing material may be injected or applied onto the first substrate 110 including the first transparent conductive material layer 132$a$ thereon. Here, the particles 170 may be selected from a polymer material group. The particles 170 may be selected from a sunlight-absorbing material group, that is, a solar energy-absorbing material group, including 4-hydroxyphenylazobenzene of a yellow wavelength range, 1-naphthylamine of a red wavelength range, and Tartrazine of a green wavelength range.

Chemical formulas 1, 2 and 3 represent chemical compound compositions of the particles including the light-absorbing material. Specially, chemical formula 1 shows 4-hydroxyphenylazobenzene, chemical formula 2 shows 1-naphthylamine, and chemical formula 3 shows Tartrazine.

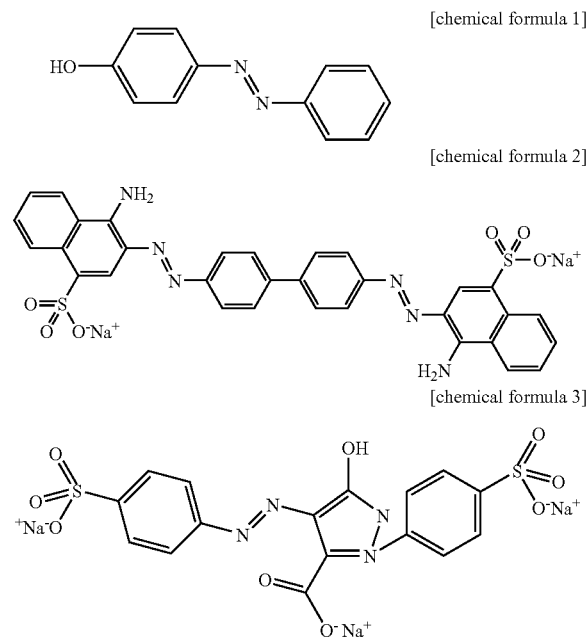

[chemical formula 1]

[chemical formula 2]

[chemical formula 3]

The particles 170 may be randomly disposed over the first substrate 110, and beneficially, the particles 170 may be injected or applied such that the distance, width and number of the particles 170 are uniform in each unit cell C.

In FIG. 4B, a second transparent conductive material layer 132b is formed on the first transparent conductive material layer 132a including the particles 170 by depositing one selected from the above-mentioned transparent conductive material group. The second transparent conductive material layer 132b may have a second thickness. It is desirable that a total thickness of the first thickness and the second thickness is more than 5,000 Å. The first and second thickness can be changed variously within a range of the total thickness. The first transparent conductive material layer 132a and the second conductive material layer 132b constitute a transparent conductive material layer 132.

The particles 170 may be injected or applied in any position from a top surface of the first substrate 110 to a top surface of the second transparent conductive material layer 132b. The particles 170 may be disposed at the top surface of the first substrate 110.

In FIG. 4C, a top surface of the transparent conductive material layer 132 is selectively etched by dipping the first substrate 110 including the transparent conductive material layer 132 into an etching bath filled with etchant or by spraying etchant onto the first substrate using a spray gun. The transparent conductive material layer 132 includes a transparent conductive oxide material, and in the transparent conductive oxide material, the etchant actively permeate into interfaces between grains. Accordingly, the interfaces become valleys, and the second transparent conductive material layer 132b has an uneven top surface having peaks and the valleys.

In FIG. 4D, a laser beam irradiation apparatus 180 is disposed under and spaced apart from the first substrate 110, on which the transparent conductive material layer 132 including the particles 170 of FIG. 4C is formed, and a laser beam is irradiated toward the first substrate 110. The laser beam, beneficially, may have a wavelength within a range of 300 nm to 1,200 nm.

If the laser beam is irradiated, the particles 170 absorb the laser beam and have high absorption energy. The particles 170 instantaneously penetrate the transparent conductive material layer 132 and break away due to explosion, etc. Accordingly, through-holes TH are formed in the transparent conductive material layer 132.

Figure 5:
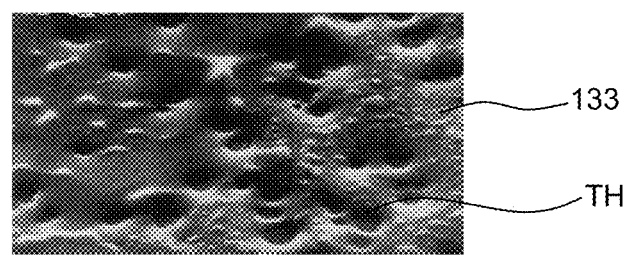
FIG. 5 is a picture of showing through-holes formed in a silicon layer according to an embodiment of the present invention.

FIG. 5 is a picture of showing through-holes formed in a silicon layer according to an embodiment of the present invention. Here, particles (not shown) of a light-absorbing material are scattered in the silicon layer 133. The through-holes TH are formed in the silicon layer 133 by irradiating a laser beam to the particles.

Next, in FIG. 4E, a transparent conductive layer 130 is formed in each unit cell C by cutting the transparent conductive material layer 132 of FIG. 4D that has the through-holes TH using a laser. The laser may be disposed over the first substrate 110 including the transparent conductive material layer 132 of FIG. 4D that has the through-holes TH. The transparent conductive layer 130 includes the first transparent conductive material layer 132a and the second transparent conductive material layer 132b.

Then, a light-absorbing material layer (not shown) having a p-i-n structure is formed by sequentially depositing a p-type silicon layer 140a, an i-type silicon layer 140b and an n-type silicon layer 140c on the first substrate 110 including the transparent conductive layer 130. The light-absorbing material layer is cut using a laser, and a light-absorbing layer 140 is formed in each unit cell C. The laser may be spaced apart from and disposed over the first substrate 110.

In FIG. 4F, a reflection material layer (not shown) is formed on the first substrate 110 including the light-absorbing layer 140 by depositing one selected from a conductive material group including aluminum (Al) and silver (Ag) that have a relatively high reflectance. The reflection material layer is cut using a laser, and a reflection electrode 150 is formed in each unit cell C. The reflection material layer may be deposited by a sputtering method.

Like this, the first substrate for a thin film solar cell according to the present invention can be manufactured.

Next, in FIG. 4G, a polymeric material layer 160 is formed on a second substrate 120 by applying one selected from a polymeric material group including black resin. Although not shown in the figure, an adhesive layer may be formed on the polymeric material layer 160 by applying an adhesive material.

In FIG. 4H, the second substrate 120 including the polymeric material layer 160 is arranged over the first substrate 110 including the transparent conductive layer 130, the light-absorbing layer 140 and the reflection electrode 150. A seal pattern (not shown) is formed to seal the first and second substrates 110 and 120 by uniformly applying a sealant along a periphery of one of the first substrate 110 and the second substrate 120 and the hardening the sealant.

According to this, the thin film solar cell according to the present invention can be fabricated.

Even though the thin film solar cell having a single junction structure is described above, the present invention can be applied to a tandem structure or a triple structure.

In the present invention, since through-holes are formed in the transparent conductive layer, the quantity of light provided to the light-absorbing layer can be increased, and the energy conversion efficiency of the thin film solar cell can be maximized.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film solar cell, comprising:

forming a first transparent conductive material layer having a first thickness on a first substrate including a plurality of unit cells;

injecting or applying light-absorbing material particles onto the first transparent conductive material layer;

forming a second transparent conductive material layer having a second thickness on the first transparent conductive material layer where the light-absorbing material particles are injected or applied;

forming through-holes in the second transparent conductive material layer by irradiating a laser beam to the particles, wherein the particles absorb the laser beam and break away, and the first transparent conductive layer is exposed through the through-holes;

forming a transparent conductive layer in each unit cell by cutting the first and second transparent conductive layers;

forming a light-absorbing layer on the transparent conductive layer;

forming a reflection electrode on the light-absorbing layer;

forming a polymeric material layer on a second substrate; and attaching the first and second substrates such that the polymeric material layer face the reflection electrode.

2. The method according to claim 1, wherein the particles are selected from a sunlight-absorbing material group including 4-hydroxyphenylazobenzene, 1-naphthylamine and Tartrazine.

3. The method according to claim 1, wherein the laser beam has a wavelength within a range of 300 nm to 1200 nm.

4. The method according to claim 1, wherein the particles are positioned between a top surface of the first substrate and a top surface of the first transparent conductive material layer.

5. The method according to claim 4, wherein the particles are disposed with a distance, width and number in each unit cell.

6. The method according to claim 4, wherein the particles are disposed randomly in each unit cell.

7. The method according to claim 1, wherein a total thickness of the first and second thicknesses is larger than 5,000 Å.

8. The method according to claim 1, further comprising selectively etching the second transparent conductive material layer to form an uneven top surface.

* * * * *